(12) United States Patent
Doneker et al.

(10) Patent No.: US 9,055,667 B2
(45) Date of Patent: Jun. 9, 2015

(54) NOISE DAMPENING ENERGY EFFICIENT TAPE AND GASKET MATERIAL

(71) Applicant: TANGITEK, LLC, Portland, OR (US)

(72) Inventors: Robert L. Doneker, Portland, OR (US); Kent G. R. Thompson, Portland, OR (US)

(73) Assignee: TANGITEK, LLC, Portland, OR (US)

( * ) Notice: Subject to any disclaimer, the term of this patent is extended or adjusted under 35 U.S.C. 154(b) by 0 days.

(21) Appl. No.: 14/194,473

(22) Filed: Feb. 28, 2014

(65) Prior Publication Data

US 2014/0174813 A1 Jun. 26, 2014

Related U.S. Application Data

(63) Continuation-in-part of application No. 13/172,694, filed on Jun. 29, 2011, now Pat. No. 8,692,137, and a continuation-in-part of application No. 13/431,746, filed on Mar. 27, 2012.

(51) Int. Cl.
*H05K 9/00* (2006.01)

(52) U.S. Cl.
CPC ............... *H05K 9/009* (2013.01); *Y10T 156/10* (2015.01); *H05K 9/0015* (2013.01); *H05K 9/0088* (2013.01)

(58) Field of Classification Search
CPC ............................ H05K 9/009; H05K 9/0015
USPC .......................................... 174/356; 277/920
See application file for complete search history.

(56) References Cited

U.S. PATENT DOCUMENTS 3,193,712 A 7/1965 Harris
4,360,704 A * 11/1982 Madry ............................ 174/36

(Continued)

FOREIGN PATENT DOCUMENTS

CN 201774688 U 3/2011
EP 0854536 A2 7/1998

(Continued)

OTHER PUBLICATIONS

Park, Ki-Yeon, et al., Application for MWNT-added Glass Fabric/Epoxy Composites to Electromagnetic Wave Shielding Enclosure, Department of Aerospace Engineering, Korea Advanced institute of Science and Technology, Composite Structures, v 81, n 3, 401-6, 2007; ISSN: 0263-8223; DOI: 10.1016/j.compstruct.2006.08.029; Publisher: Elsevier Science Ltd., UK.

(Continued)

*Primary Examiner* — Hung V Ngo
(74) *Attorney, Agent, or Firm* — Marger Johnson & McCollom P.C.

(57) ABSTRACT

A noise dampening tape and gasket material for reducing or preventing unwanted electromagnetic interference from escaping or entering an enclosure. The noise dampening gasket includes an inner core section, a carbon material layer surrounding the inner core section, an insulating layer surrounding the carbon material layer, and a metal shield layer surrounding the insulating layer. The noise dampening tape includes a metal shield layer, an insulating layer adjacent to and in contact with the metal shield layer, a carbon material layer adjacent to and in contact with the insulating layer, and an adhesive layer disposed on a surface of the carbon material layer. A second adhesive layer can be disposed on a surface of the metal shield layer. The carbon fibers can be coated with silicone or polytetrafluoroethylene to enhance mechanical and electrical properties of the carbon material layer.

24 Claims, 12 Drawing Sheets

(56) References Cited

U.S. PATENT DOCUMENTS

| | | |
|---|---|---|
| 4,388,623 A | 6/1983 | Crook et al. |
| 4,684,020 A | 8/1987 | Ohlbach |
| 4,703,134 A | 10/1987 | Uematsu |
| 4,822,950 A | 4/1989 | Schmitt |
| 4,986,372 A | 1/1991 | Ganssle |
| 5,010,209 A | 4/1991 | Marciano-Agostinelli et al. |
| 5,028,740 A | 7/1991 | Tomiya |
| 5,043,538 A | 8/1991 | Hughey et al. |
| 5,170,010 A | 12/1992 | Aldissi |
| 5,171,938 A | 12/1992 | Katsumata et al. |
| 5,236,736 A | 8/1993 | Kawakami et al. |
| 5,300,733 A | 4/1994 | Uematsu |
| 5,401,901 A | 3/1995 | Gerry et al. |
| 5,486,648 A | 1/1996 | Chan et al. |
| 5,493,070 A | 2/1996 | Habu |
| 5,539,148 A | 7/1996 | Konishi et al. |
| 6,104,357 A | 8/2000 | Brage |
| 6,215,070 B1 | 4/2001 | King |
| 6,274,066 B1 * | 8/2001 | Easter ............... 252/511 |
| 6,288,372 B1 | 9/2001 | Sandberg et al. |
| 6,384,337 B1 | 5/2002 | Drum |
| 6,503,364 B1 | 1/2003 | Masuda et al. |
| 6,514,608 B1 | 2/2003 | Foulger |
| 6,526,860 B2 | 3/2003 | Facciano et al. |
| 6,697,248 B1 | 2/2004 | Luch |
| 6,786,771 B2 | 9/2004 | Gailus |
| 6,825,411 B2 | 11/2004 | Pommerenke et al. |
| 6,828,501 B2 | 12/2004 | Eves et al. |
| 6,897,826 B1 | 5/2005 | Kunz |
| 6,979,709 B2 | 12/2005 | Smalley et al. |
| 7,087,842 B2 | 8/2006 | Belli et al. |
| 7,202,418 B2 | 4/2007 | Glew |
| 7,276,664 B2 | 10/2007 | Gagnon |
| 7,345,242 B2 | 3/2008 | Chen |
| 7,449,631 B2 | 11/2008 | Lee et al. |
| 7,459,627 B2 | 12/2008 | Lee et al. |
| 7,491,883 B2 | 2/2009 | Lee et al. |
| 7,688,274 B2 | 3/2010 | Gorrell et al. |
| 7,738,942 B2 | 6/2010 | Weiner et al. |
| 7,750,240 B2 | 7/2010 | Jiang et al. |
| 7,939,167 B2 | 5/2011 | Kim et al. |
| 8,324,515 B2 | 12/2012 | Stevenson et al. |
| 8,583,259 B2 * | 11/2013 | Liu et al. ............... 607/119 |
| 2002/0189846 A1 | 12/2002 | Massey |
| 2004/0020681 A1 | 2/2004 | Hjortstam et al. |
| 2004/0154911 A1 | 8/2004 | Burgess et al. |
| 2005/0001780 A1 | 1/2005 | Aisenbrey |
| 2005/0011612 A1 | 1/2005 | Yakushiji et al. |
| 2005/0045358 A1 | 3/2005 | Arnold |
| 2005/0078050 A1 | 4/2005 | Aisenbrey |
| 2006/0083948 A1 | 4/2006 | Toshiyuki et al. |
| 2006/0237221 A1 | 10/2006 | Glew |
| 2007/0068787 A1 | 3/2007 | Burgess et al. |
| 2007/0089285 A1 | 4/2007 | Utecht et al. |
| 2007/0116916 A1 | 5/2007 | Ito et al. |
| 2007/0293086 A1 | 12/2007 | Liang et al. |
| 2008/0018549 A1 | 1/2008 | Suzuki et al. |
| 2008/0058467 A1 | 3/2008 | Takagi et al. |
| 2008/0129638 A1 | 6/2008 | Ong |
| 2009/0095523 A1 | 4/2009 | Stevenson et al. |
| 2009/0104405 A1 | 4/2009 | Patten et al. |
| 2009/0111325 A1 | 4/2009 | Ju |
| 2009/0114420 A1 * | 5/2009 | Winterhalter ............... 174/126.2 |
| 2009/0120664 A1 | 5/2009 | Clark et al. |
| 2009/0120681 A1 | 5/2009 | Matsuzaki |
| 2009/0130995 A1 | 5/2009 | Wang Chen |
| 2009/0159328 A1 | 6/2009 | Dai et al. |
| 2009/0287426 A1 | 11/2009 | Kukowski |
| 2009/0291608 A1 | 11/2009 | Choi et al. |
| 2010/0000754 A1 | 1/2010 | Mann et al. |
| 2010/0052992 A1 | 3/2010 | Okamura et al. |
| 2010/0086729 A1 | 4/2010 | Long |
| 2010/0096160 A1 | 4/2010 | Gareis et al. |
| 2010/0159240 A1 | 6/2010 | Shah et al. |
| 2010/0178487 A1 | 7/2010 | Arai et al. |
| 2010/0188833 A1 | 7/2010 | Liang et al. |
| 2010/0236812 A1 | 9/2010 | Laudenslager et al. |
| 2010/0300744 A1 | 12/2010 | Romanko et al. |
| 2011/0005808 A1 | 1/2011 | White et al. |
| 2011/0062134 A1 | 3/2011 | Lochtman et al. |
| 2011/0209909 A1 | 9/2011 | Doneker et al. |
| 2011/0253441 A1 | 10/2011 | Doneker et al. |
| 2011/0253475 A1 | 10/2011 | Doneker et al. |
| 2011/0266023 A1 | 11/2011 | Doneker et al. |
| 2011/0309845 A1 | 12/2011 | Kukowski |

FOREIGN PATENT DOCUMENTS

| | | |
|---|---|---|
| EP | 1191351 A2 | 3/2002 |
| EP | 1447819 A1 | 8/2004 |
| EP | 1612187 A1 | 1/2006 |
| JP | 54139358 | 10/1979 |
| JP | 55068703 | 5/1980 |
| JP | 57166702 | 10/1982 |
| JP | 58184805 | 10/1983 |
| JP | 59061203 | 4/1984 |
| JP | 60010806 | 1/1985 |
| JP | 06-021683 | 1/1994 |
| JP | 2004-095847 | 3/2004 |
| JP | 2005012841 A | 1/2005 |
| JP | 2005-285923 | 10/2005 |
| JP | 2006-332260 | 12/2006 |
| JP | 2009174956 | 8/2009 |
| JP | 2010062571 | 3/2010 |
| KR | 10-2011-0016661 | 2/2011 |
| TW | 200929459 | 7/2009 |
| TW | 200929725 | 7/2009 |
| WO | 2005122331 A1 | 12/2005 |
| WO | 2008012300 A1 | 1/2008 |
| WO | 2010095925 A1 | 8/2010 |

OTHER PUBLICATIONS

Liu et al., "Measurement on Dipole Antenna with Light Polarized Nano-Material (PNM) Textile Reflector," IEEE MTT-S Intl. Microwave Symposium Digest, 2009. Jun. 7-12, 2009, pp. 1069-1072.

Koch, et al., Patrick, "0.6-M Antennae for the Ambia Interferometer Array," Proceedings of the European Conference on Antennas and Propagation: EuCAP 2006 (ESA SP-626), Nov. 6-10, 2006, Nice, France, Editors: H. Lacoste & I. Ouwehand, publilshed on CDROM, p. 668.1.

European Patent Office, Extended European Search Report, EP application No. 12751876.9, Munich, Germany, 11 pages, Jul. 21, 2014.

* cited by examiner

NOISE DAMPENING ENERGY EFFICIENT TAPE AND GASKET MATERIAL

CROSS REFERENCE TO RELATED APPLICATIONS

This application is a continuation-in-part of U.S. application Ser. No. 13/172,694, filed Jun. 29, 2011, now U.S. Pat. No. 8,692,137, issued Apr. 8, 2014, and is a continuation-in-part of copending U.S. application Ser. No. 13/431,746, filed Mar. 27, 2012, now U.S. Pat. No. 8,854,275, issued Oct. 7, 2014, incorporated by reference herein.

TECHNICAL FIELD

This disclosure relates to electromagnetic noise dampening materials, and, more particularly, to noise dampening energy efficient tape and gasket material.

BACKGROUND

Electromagnetic noise can escape or otherwise be emitted from enclosures, which can interfere with electronic circuits or other devices nearby. Signals transmitted over electrical cables or through the air can be impacted, even severely disrupted, by the electromagnetic emissions. Most enclosures have edges, seams, openings, physical interfaces, and the like, through which the electromagnetic noise can escape. The types of enclosures that can cause such issues include personal computers, computer server equipment, broadcast equipment, sensitive satellite control devices, cellular tower equipment, handheld devices, and indeed, any enclosure that surrounds or contains electrical components such as circuit elements, conductors, or the like.

In some cases, it is desirable to prevent electromagnetic radiation or noise originating from external sources from penetrating the enclosure through similar edges, seams, openings, interfaces, and the like, which can otherwise cause unwanted interference with circuits and other components located within the enclosure. This can be of particular concern with test chambers or other similar types of test equipment and enclosures.

Government agencies such as the Federal Communications Commission (FCC), among other private and public bodies, require the adherence to exacting standards for the emission of electromagnetic radiation. Much effort is expended in complying with the various laws and rules governing such emissions. Compliance through testing, redesigns, certifications, and the like, quite often requires the devotion of significant resources and time by product developers.

Conventional techniques for addressing these problems include redesigning the enclosure to reduce the number of places in which the electromagnetic energy escapes and/or enters the enclosure. Other typical approaches include covering the seams and openings using sheet metal. Still other approaches require arduous testing after each iteration of enclosure redesign, leading to further enclosure redesigns. Efforts to address the consequences of unwanted electromagnetic noise unfortunately can lead to less efficient designs. For instance, the energy efficiency of the system can become a concern because one approach for overcoming unwanted electromagnetic interference is to boost the power of the signals themselves to compensate for the noise. Such approaches lead to energy waste and are environmentally unwise.

Accordingly, a need remains for a noise dampening energy efficient tape and gasket material for reducing unwanted electromagnetic interference between enclosures and devices external to the enclosures. In addition, it would be desirable to have a more energy efficient and cost effective solution for addressing leakage of electromagnetic noise to and from enclosures. Embodiments of the invention address these and other limitations in the prior art.

The foregoing and other features of the invention will become more readily apparent from the following detailed description, which proceeds with reference to the accompanying drawings.

DETAILED DESCRIPTION

Embodiments of the invention include noise dampening energy efficient tape and gaskets, and associated materials and components. The terms "electromagnetic noise" or "interference" as used herein generally refer to unwanted electromagnetic waves or signals having the potential to disrupt the operation of electronic equipment or other devices. It should be understood, however, that the embodiments disclosed herein can provide beneficial electromagnetic wave dampening for any type of electromagnetic signal, whether or not it is considered "noise" per se, and whether or not actual disruption is caused, and therefore, such terms should be construed broadly.

Figure 1A:
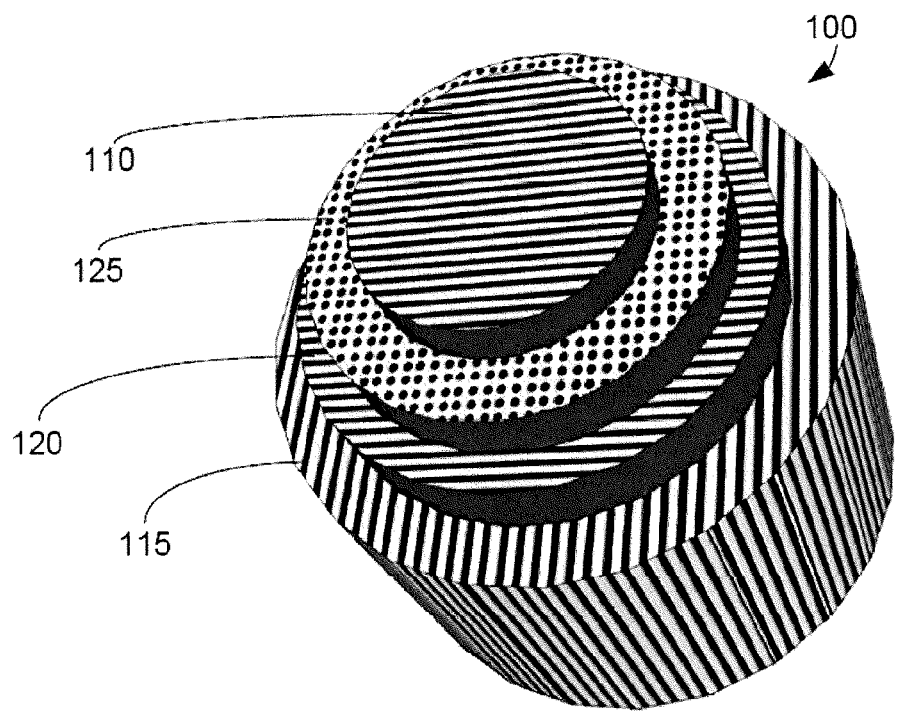
FIG. 1A illustrates a perspective view of an example of a noise dampening energy efficient circuit gasket according to an embodiment of the present invention.
Figure 1B:
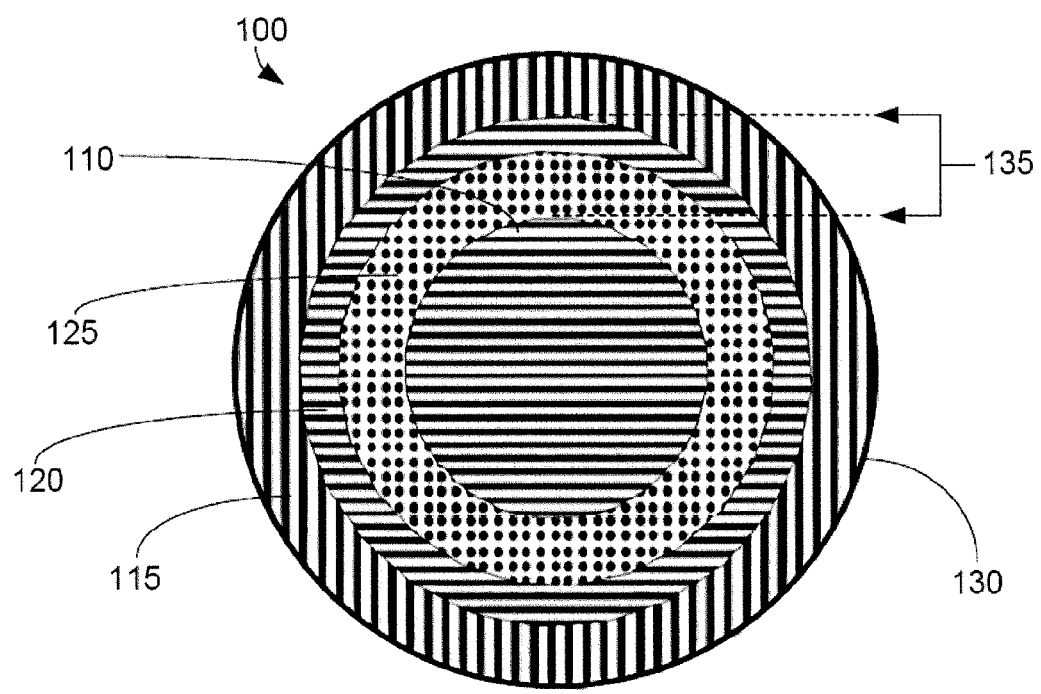
FIG. 1B illustrates a plan view of the noise dampening energy efficient gasket of FIG. 1A.

FIG. 1A illustrates a perspective view of an example of a noise dampening energy efficient circuit gasket 100 according to an embodiment of the present invention. FIG. 1B illustrates a plan view of the noise dampening gasket 100 of FIG. 1A. Reference is now made to FIGS. 1A and 1B.

The noise dampening gasket 100 includes an inner core section 110, a carbon material layer 125 surrounding the inner core section 110, an insulating layer 120 surrounding the carbon material layer 125, and a metal shield layer 115 surrounding the insulating layer 120. In some embodiments, an outer insulating and protective film 130 covers the metal shield layer 115.

The carbon material layer 125 is preferably up to one (1) millimeter in thickness, although thicker layers can be used. In some embodiments, the carbon material layer 125 can include resin-impregnated woven carbon fiber fabric. In a preferred embodiment, the resin-impregnated carbon material has a specific resistance no greater than 100 $\Omega/cm^2$. In some embodiments, the carbon material layer 110 includes carbon nanotube material.

The carbon material layer 110 can include strands of carbon fiber running along a length of the gasket 100, for example, in parallel relative to an axial direction of the inner core section 110. In some embodiments, substantially all of the fiber strands of the carbon material layer 125 are disposed in parallel relative to the axial direction of the inner core section 110.

Alternatively, the strands of carbon fiber may run circumferentially around the gasket 100 relative to the inner core section 110. In yet another configuration, the multiple layers of strands of carbon fiber can be disposed one atop another, and/or woven, with each layer having the carbon strands orientated at a different angle respective to one another. For example, one layer of strands can be orientated at 90 degrees relative to another adjacent layer.

In some embodiments, the carbon material layer 125 includes a first layer having fiber strands orientated in a first direction at substantially 45 degrees relative to an axial direction of the inner core section 110, and a second layer having fiber strands orientated in a second direction crossing the fiber strands of the first layer at substantially 45 degrees relative to the axial direction of the inner core section 110.

In this manner, electrons can travel along certain paths or patterns in the carbon material layer, allowing the electromagnetic noise characteristics of the environment to be controlled. It should be understood that a weave pattern can be designed to include other forms or patterns depending on the qualities and noise characteristics of a particular circuit or enclosure with which the gasket 100 is used.

The metal shield layer 115 can be a flexible conducting metal layer, including for example, copper (Cu), but can include any suitable conductor including gold (Au), silver (Ag), and so forth. The inner core section 110 is formed from either a solid pliable shape of conducting or non-conducting material. The insulating layer 120 is preferably glass fiber material, but any suitable dielectric insulating material can be used.

The metal shield layer 115, the insulating layer 120, and the carbon material layer 125 form an electromagnetic dampening zone 135 surrounding the inner core section 110 in which the carbon material layer 125 enhances the shielding characteristics of the metal shield layer 115. The positioning of the carbon material layer 125 with respect to the metal shield layer 115, separated by the insulating layer 120, enhances the metal shield layer operation of dampening electromagnetic noise.

The carbon material layer 125 can directly contact the inner core section 110. Similarly, the metal shield layer 115 can directly contact the insulating layer 120. In addition, the insulating layer 120 can directly contact the carbon material layer 125. It should be understood that while the perspective view of the gasket 100 in FIG. 1A shows different layer protruding from the gasket, the layers of the gasket can be flush so that the gasket 100 is formed in a substantially cylindrical embodiment. It should also be understood that the cross sectional shape of the gasket 100 need not be cylindrical, but can be formed in other shapes such as rectangular, triangular, hexagonal, and so forth.

Figure 2A:
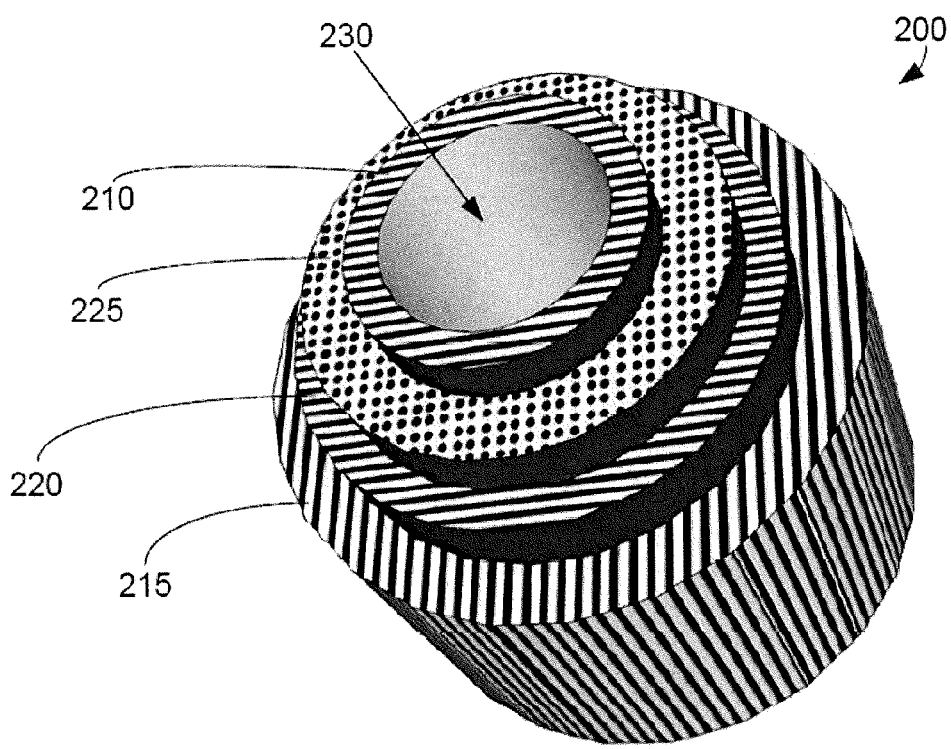
FIG. 2A illustrates a perspective view of another example of a noise dampening energy efficient circuit gasket according to another embodiment of the present invention.
Figure 2B:
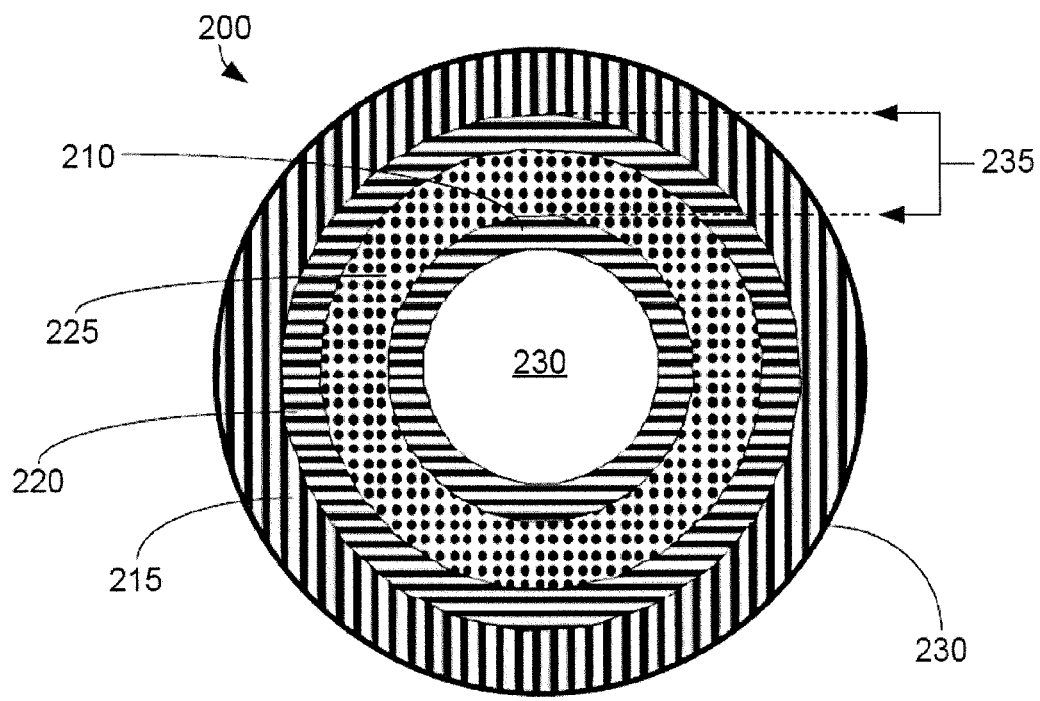
FIG. 2B illustrates a plan view of the noise dampening energy efficient gasket of FIG. 2A.

FIG. 2A illustrates a perspective view of another example of a noise dampening energy efficient circuit gasket 200 according to another embodiment of the present invention. FIG. 2B illustrates a plan view of the noise dampening gasket 200 of FIG. 2A. Reference is now made to FIGS. 2A and 2B.

The noise dampening gasket 200 includes an inner core section 210, a carbon material layer 225 surrounding the inner core section 210, an insulating layer 220 surrounding the carbon material layer 225, and a metal shield layer 215 surrounding the insulating layer 220. In some embodiments, an outer insulating and protective film 230 covers the metal shield layer 215. The inner core section 210 includes a cylindrical opening 230 therein extending through the gasket.

The composition, dimensions, and characteristics of the components of gasket 200 are similar to or the same as those described above with reference to gasket 100, and so an abbreviated description is included with reference to gasket 200. The primary difference is that the inner core section 210 includes the opening 230 therein for receiving a conductor or other type of wire or cable.

In similar fashion, the metal shield layer 215, the insulating layer 220, and the carbon material layer 225 form an electromagnetic dampening zone 235 surrounding the inner core section 210 in which the carbon material layer 225 enhances the shielding characteristics of the metal shield layer 215, thereby reducing or preventing unwanted electromagnetic interference.

Figure 3:
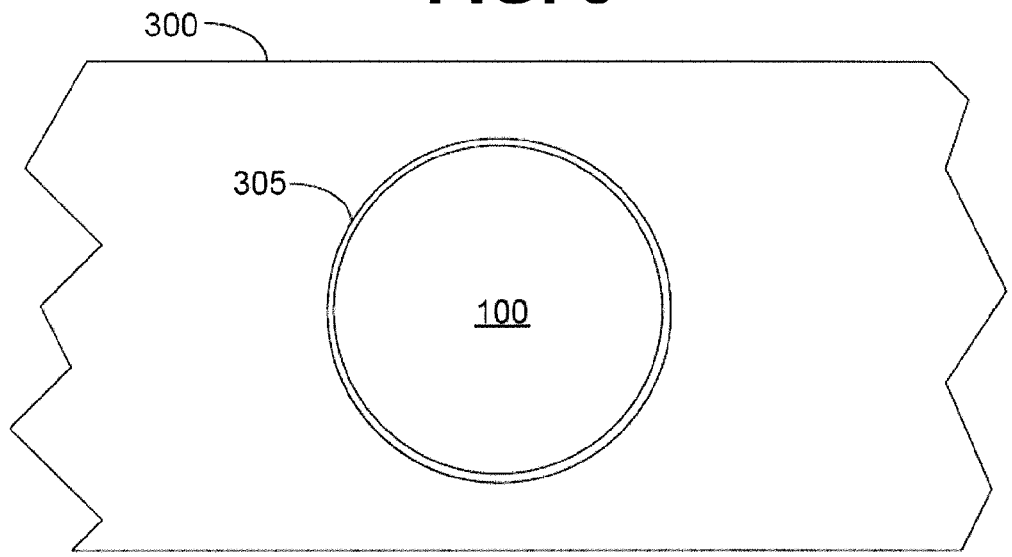
FIG. 3 illustrates a plan view of an enclosure having the noise dampening gasket of FIGS. 1A and 1B fitted thereto.

FIG. 3 illustrates a plan view of an enclosure 300 having the noise dampening gasket 100 of FIGS. 1A and 1B fitted thereto. The enclosure 300 may include walls that form a container for sensitive electronics such as circuits components, conductors, or the like. An opening or interface 305 can be disposed in a wall of the enclosure 300, and the noise dampening gasket 100 can permanently or temporarily "plug" the opening. FIG. 3 illustrates the gasket 100 inserted in the opening 305 of the wall of the enclosure 300 so that electromagnetic noise is reduced or otherwise prevented from escaping or entering the enclosure 300.

Figure 4:
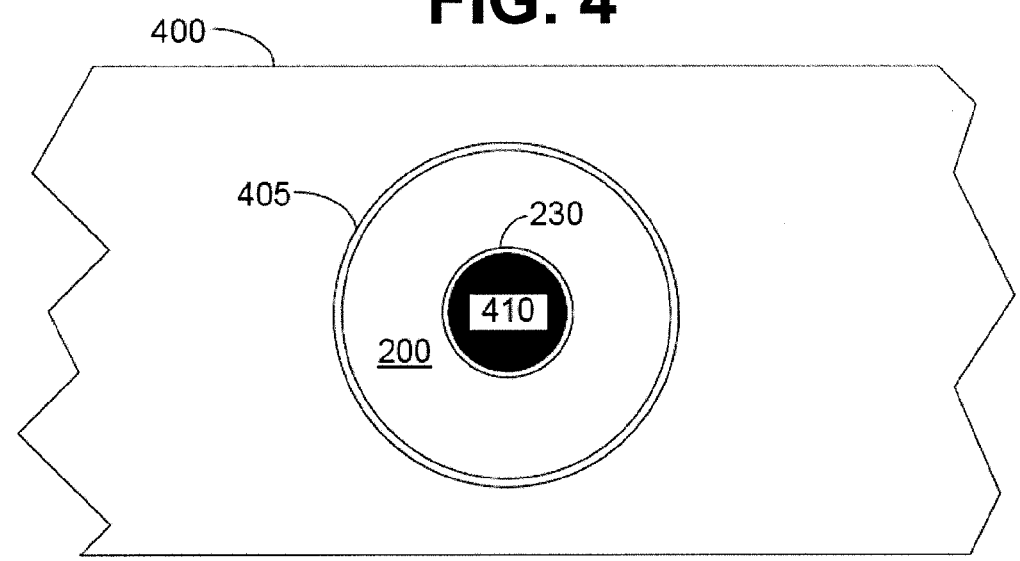
FIG. 4 illustrates a plan view of an enclosure having the noise dampening gasket of FIGS. 2A and 2B fitted thereto.
Figure 5:
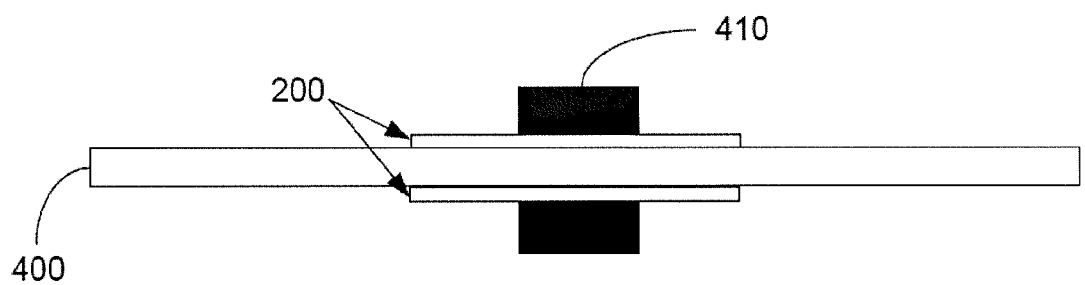
FIG. 5 illustrates a side elevation view of the enclosure of FIG. 4 having the noise dampening gasket of FIGS. 2A and 2B fitted thereto.

FIG. 4 illustrates a plan view of an enclosure 400 having the noise dampening gasket 200 of FIGS. 2A and 2B fitted thereto. FIG. 5 illustrates a side elevation view of the enclosure 400 of FIG. 4 having the noise dampening gasket 200 of FIGS. 2A and 2B fitted thereto. Reference is now made to FIGS. 4 and 5.

The enclosure 400 may include walls that form a container for sensitive electronics such as circuit components, conductors, or the like. An opening or interface 405 can be disposed in a wall of the enclosure 400, and the noise dampening gasket 400 can permanently or temporarily "plug" the opening. FIG. 4 illustrates the gasket 200 inserted in the opening 405 of the wall of the enclosure 400 so that electromagnetic noise is reduced or otherwise prevented from escaping or entering the enclosure 400.

Moreover, a conductor 410 such as a wire or cable can be disposed within the opening 230 of the inner core section 210 of the gasket 200 so that devices or components contained within the enclosure 400 can interface with devices, power sources, or other components located external to the enclosure 400. The electromagnetic dampening zone 235 is structured to reduce electromagnetic noise emitted by the conductor 410. In addition, the gasket 200 is structured to prevent electromagnetic noise from escaping or entering the enclosure 400.

Figure 6A:
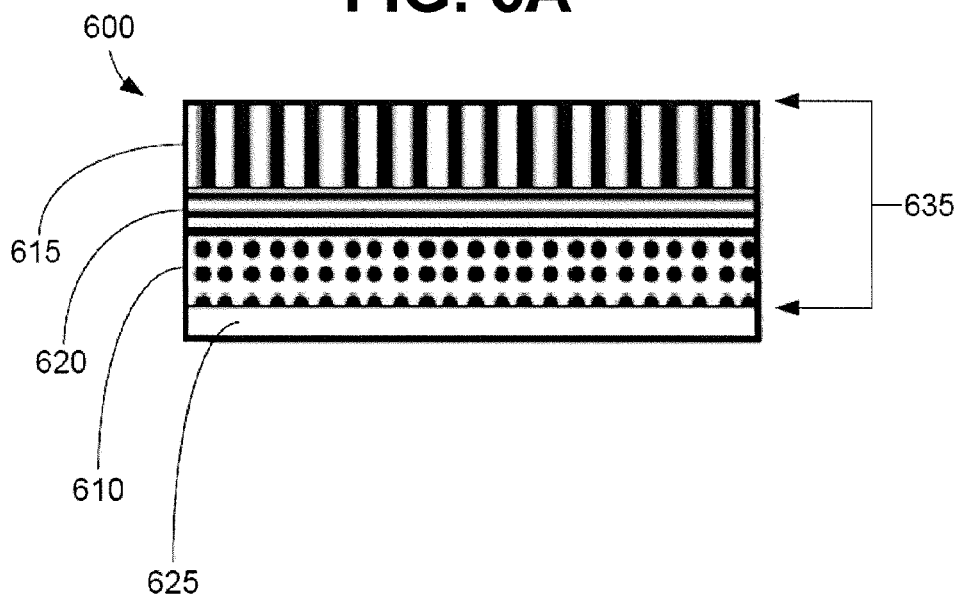
FIG. 6A illustrates a cross sectional view of a noise dampening energy efficient tape according to another example embodiment of the present invention.
Figure 6B:
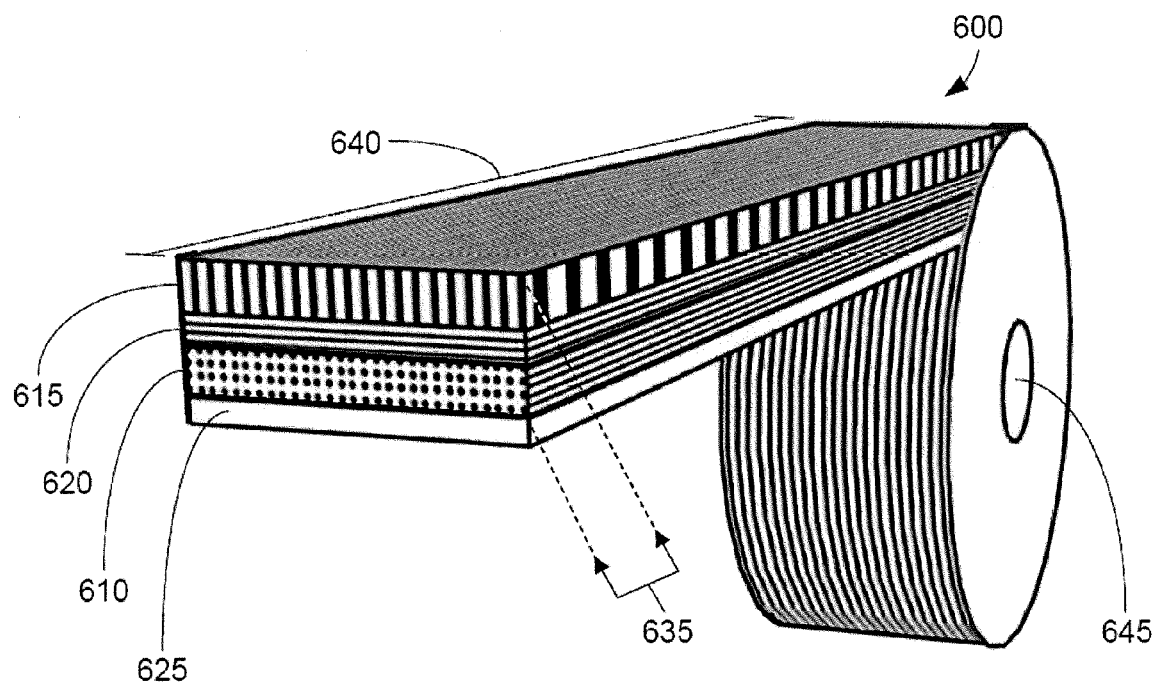
FIG. 6B illustrates a perspective view of the noise dampening energy efficient tape of FIG. 6A.

FIG. 6A illustrates a cross sectional view of a noise dampening energy efficient tape 600 according to another example embodiment of the present invention. FIG. 6B illustrates a perspective view of the noise dampening tape 600 of FIG. 6A. Reference is now made to FIGS. 6A and 6B.

The noise dampening tape 600 includes a metal shield layer 615, an insulating layer 620 adjacent to and in contact with the metal shield layer 615, a carbon material layer 610 adjacent to and in contact with the insulating layer 620, and an adhesive layer 625 disposed on a surface of the carbon material layer 610.

The carbon material layer 610 is preferably up to one (1) millimeter in thickness, although thicker layers can be used. In some embodiments, the carbon material layer 610 can include resin-impregnated woven carbon fiber fabric. In a preferred embodiment, the resin-impregnated carbon material has a specific resistance no greater than 100 $\Omega/cm^2$. In some embodiments, the carbon material layer 610 includes carbon nanotube material.

The carbon material layer 610 can include strands of carbon fiber running along a length of the tape 600, for example, in parallel relative to the lengthwise direction 640. In some embodiments, substantially all of the fiber strands of the carbon material layer 610 are disposed in parallel relative to the lengthwise direction 640 of the tape 600. The tape can be wound or otherwise disposed around core 645 for easy storage, transporting and dispensing.

In some embodiments, the multiple layers of strands of carbon fiber can be disposed one atop another, and/or woven, with each layer having the carbon strands orientated at a different angle respective to one another. For example, one layer of strands can be orientated at 90 degrees relative to another adjacent layer. In some embodiments, the carbon material layer 610 includes a first layer having fiber strands orientated in a first direction at substantially 45 degrees relative to a lengthwise direction 640 of the tape, and a second layer having fiber strands orientated in a second direction crossing the fiber strands of the first layer at substantially 45 degrees relative to the lengthwise direction 640 of the tape.

In this manner, electrons can travel along certain paths or patterns in the carbon material layer, allowing the electromagnetic noise characteristics of the environment to be controlled. It should be understood that a weave pattern can be designed to include other forms or patterns depending on the qualities and noise characteristics of a particular enclosure or surface with which the tape 600 is used.

The metal shield layer 615 can be a flexible conducting metal layer, including for example, copper (Cu), but can include any suitable conductor including gold (Au), silver (Ag), and so forth. The insulating layer 620 is preferably flexible glass fiber material, but any suitable flexible dielectric insulating material can be used.

The metal shield layer 615, the insulating layer 620, and the carbon material layer 610 form an electromagnetic dampening zone 635 in which the carbon material layer 610 enhances the shielding characteristics of the metal shield layer 615. The positioning of the carbon material layer 610 with respect to the metal shield layer 615, separated by the insulating layer 620, enhances the metal shield layer operation of dampening electromagnetic noise.

Figure 7A:
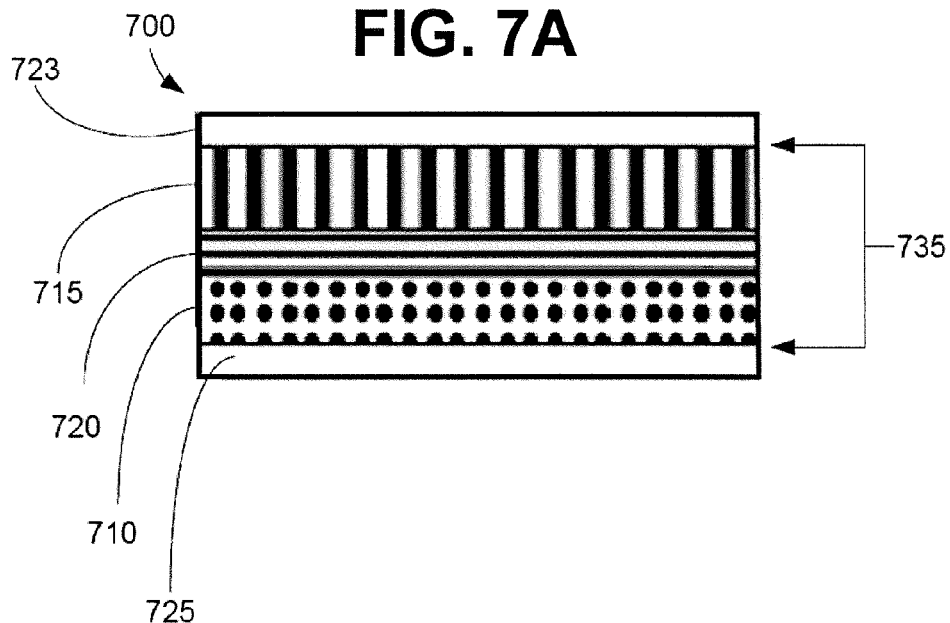
FIG. 7A illustrates a cross sectional view of a noise dampening energy efficient tape according to another example embodiment of the present invention.
Figure 7B:
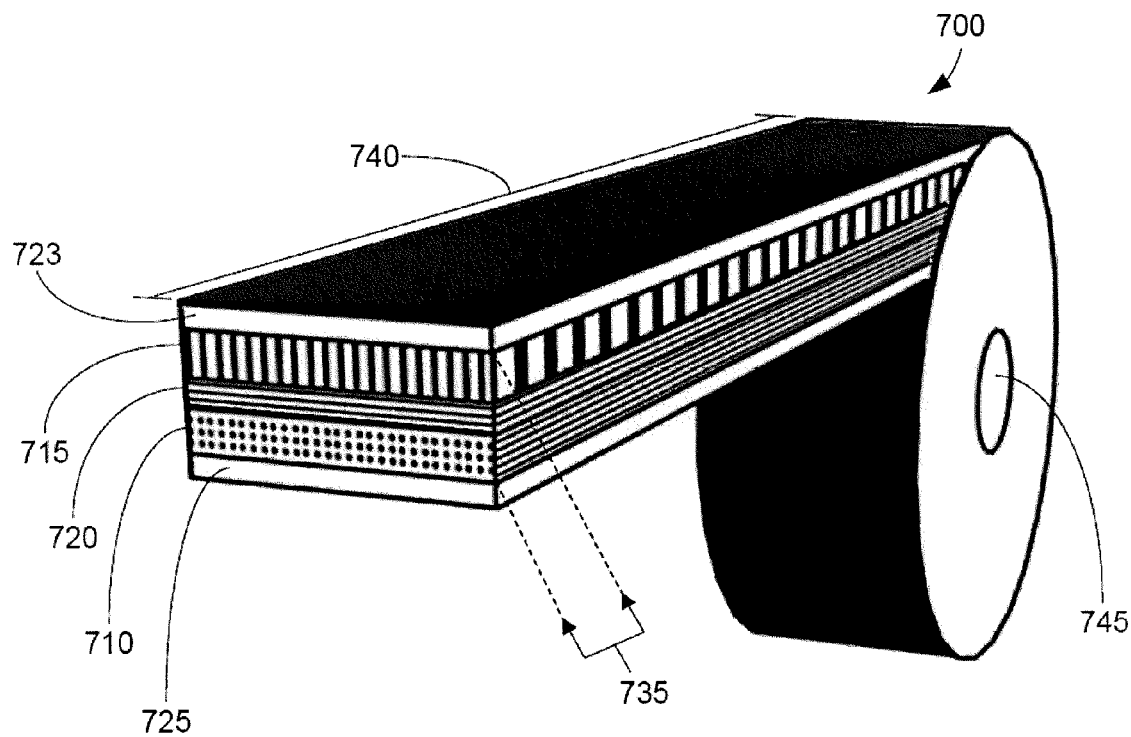
FIG. 7B illustrates a perspective view of the noise dampening energy efficient tape of FIG. 7A.

FIG. 7A illustrates a cross sectional view of a noise dampening energy efficient tape 700 according to another example embodiment of the present invention. FIG. 7B illustrates a perspective view of the noise dampening tape 700 of FIG. 7A. Reference is now made to FIGS. 7A and 7B.

The noise dampening tape 700 includes a metal shield layer 715, an insulating layer 720 adjacent to and in contact with the metal shield layer 715, a carbon material layer 710 adjacent to and in contact with the insulating layer 720, and an adhesive layer 725 disposed on a surface of the carbon material layer 710. In addition, the noise dampening tape 700 includes a second adhesive layer 723 disposed on a surface of the metal shield layer 715.

The composition, dimensions, and characteristics of the components of noise dampening tape 700 are similar to or the same as those described above with reference to noise dampening tape 600, and so an abbreviated description is included with reference to tape 700.

Electromagnetic noise can be prevented from escaping or entering an enclosure, or otherwise passing through a surface, depending on the orientation of the double adhesive tape 700. If it is desirable to prevent electromagnetic noise from escaping an enclosure, the tape 700 is orientated so that the carbon material layer 710 is positioned toward the inside of the enclosure, and the metal shield layer is positioned toward the outside of the enclosure. If placed within the inside of the enclosure, one adhesive layer can be used to affix the tape in the proper orientation to the surfaces of the inside of the enclosure. If placed outside of the enclosure, the other adhesive layer can be used to affix the tape in the proper orientation to the surfaces of the outside of the enclosure.

Conversely, if it is desirable to prevent electromagnetic noise from entering the enclosure, the tape 700 is orientated so that the carbon material layer 710 is positioned toward the outside of the enclosure, and the metal shield layer is positioned toward the inside of the enclosure. Since the tape 700 includes adhesive on both upper and lower surfaces, positioning and attaching the tape is made simple for either orientation.

The metal shield layer 715, the insulating layer 720, and the carbon material layer 710 form an electromagnetic dampening zone 735 in which the carbon material layer 710 enhances the shielding characteristics of the metal shield layer 715. The positioning of the carbon material layer 710 with respect to the metal shield layer 715, separated by the insulating layer 720, enhances the metal shield layer operation of dampening electromagnetic noise.

Figure 8:
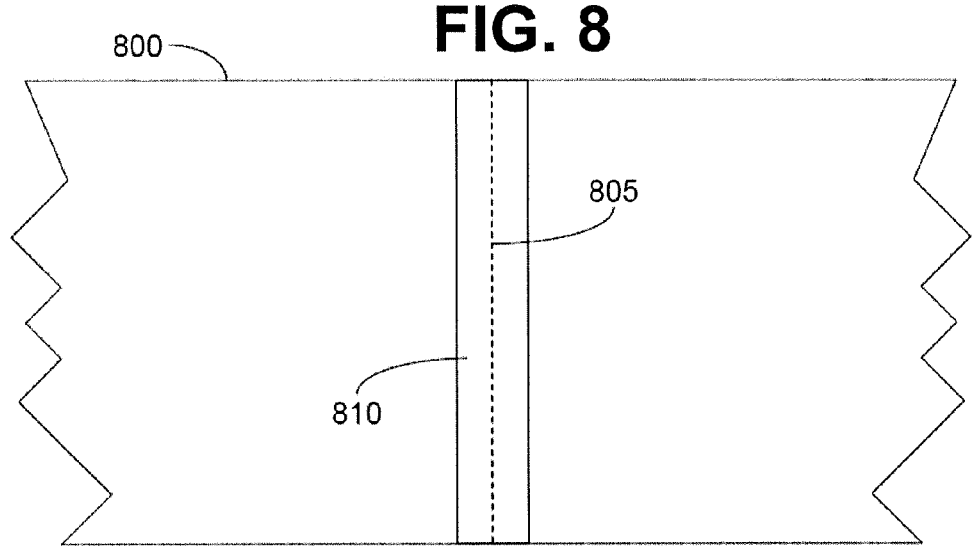
FIG. 8 illustrates a plan view of an enclosure having the noise dampening tape applied thereto along a seam.

FIG. 8 illustrates a plan view of an enclosure and/or surface 800 having the noise dampening tape 810 applied thereto along a seam. The noise dampening tape 810 corresponds to either the noise dampening tape 600 or the noise dampening tape 700 described above. The enclosure 800 can include walls or surfaces in which a seam 805 is present. The noise dampening tape 810 can be disposed over the seam to reduce or prevent electromagnetic noise from passing through the seam. It should be understood that the noise dampening tape 810 can be disposed on either side of the seam 805. Moreover, the noise dampening tape 810 can be disposed over the seam 805 of any surface, whether as part of the enclosure 800, or as a separate standalone surface. In other words, the noise dampening tape 600 can cover one or more seams 805 associated with one or more surfaces 800.

Figure 9:
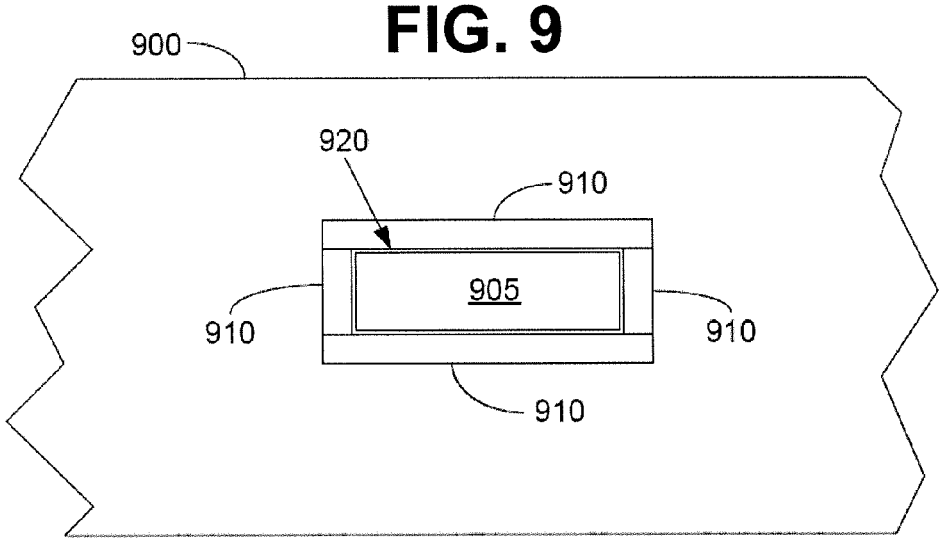
FIG. 9 illustrates a plan view of an enclosure having the noise dampening tape applied thereto around a physical interface.

FIG. 9 illustrates a plan view of an enclosure and/or surface 900 having the noise dampening tape 910 applied thereto around a physical device 905 or interface. The noise dampening tape 910 corresponds to either the noise dampening tape 600 or the noise dampening tape 700 described above. One or more openings or interfaces 920 may be disposed through one or more surfaces 900. A physical component or device 905 can be disposed in the one or more openings 920. The component 905 can be, for example, a control panel, an input/output interface, a ventilation unit, an access panel, or the like. The noise dampening tape 910 can be disposed on the one or more surfaces 900 around the component 905, and/or covering any cracks between the physical component 905 and the one or more openings 920.

Figure 10:
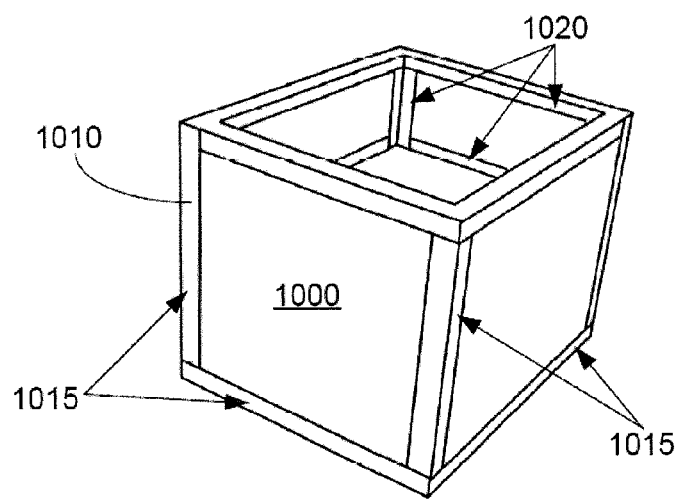
FIG. 10 illustrates a perspective view of an enclosure having the noise dampening tape applied to edges thereof.

FIG. 10 illustrates a perspective view of an enclosure 1000 having the noise dampening tape 1010 applied to outside edges 1015 and inside edges 1020 thereof. The noise dampening tape 1010 corresponds to either the noise dampening tape 600 or the noise dampening tape 700 described above. Edges of enclosures are often vulnerable to leakages due to the nature of the bends of the walls or the surface couplings, and can therefore contribute to leaks in electromagnetic noise.

The noise dampening tape 1010 can be disposed on inside edges 1020 with the carbon material layer orientated either toward the inside of the enclosure 1000 or toward the outside of the enclosure 1000. Moreover, the noise dampening tape 1010 can be disposed on outside edges 1015 with the carbon material layer orientated either toward the inside of the enclosure 1000 or toward the outside of the enclosure 1000. When the carbon material layer is orientated toward the inside of the enclosure, electromagnetic noise is contained within the enclosure and leakages are reduced or eliminated. Alternatively, when the carbon material layer is orientated toward the outside of the enclosure, electromagnetic noise is prevented from penetrating the enclosure.

Figure 11:
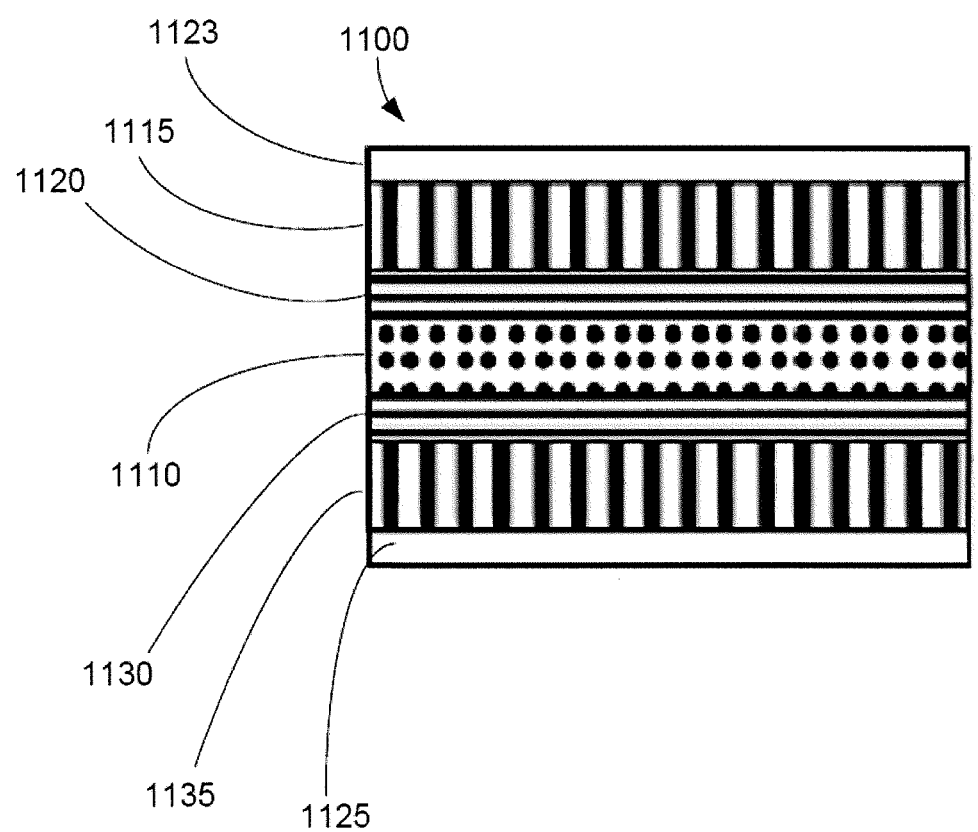
FIG. 11 illustrates a cross sectional view of a multi-directional noise dampening energy efficient tape according to yet another example embodiment of the present invention.

FIG. 11 illustrates a cross sectional view of a multi-directional noise dampening energy efficient tape 1100 according to yet another example embodiment of the present invention.

The multi-directional noise dampening tape 1100 can dampen electromagnetic noise irrespective of the direction in which the electromagnetic waves are incident upon the tape. In other words, the noise dampening tape can prevent or reduce electromagnetic noise or radiation from passing in either direction through the tape.

The multi-directional noise dampening tape 1100 includes a first metal shield layer 1115, a first insulating layer 1120 adjacent to and in contact with the first metal shield layer 1115, a carbon material layer 1110 adjacent to and in contact with the first insulating layer 1120, a second insulating layer 1130 adjacent to and in contact with the carbon material layer 1110, and a second metal shield layer 1135 adjacent to and in contact with the second insulating layer 1130. In addition, the tape 1100 can include an adhesive layer 1123 disposed on a surface of the first metal shield layer 1115, and/or an adhesive layer 1125 disposed on a surface of the second metal shield layer 1135.

Besides the difference in the number of layers in the tape, the composition, dimensions, and characteristics of the components of noise the dampening tape 1100 are similar to or the same as those described above with reference to the noise dampening tapes 600 and 700, and therefore, a detailed description is omitted for the sake of brevity. It should be understood, however, that the noise dampening tape 1100 can be used in conjunction with any of the embodiments or usages described above.

While some examples of noise dampening gasket and tape material types and configurations are disclosed herein, persons with skill in the art will recognize that the inventive concepts disclosed herein can be implemented with a variety of different circuit gaskets, tapes, enclosures, shapes, and forms. The thickness of each of the various layers including the carbon material layer, the metal shield layers, the glass fiber material layers, and/or the insulating dielectric layers, can be, for example, up to one (1) millimeter in thickness, although in practice, some layers are designed to be thicker than other layers, and can be sized according to the expected frequencies at which signals are to be operated. For example, with higher frequency signals, thicker layers can be used. Thus, higher frequency signals are supported in a lower-noise environment. Further, each of the layers individually or together may have various degrees of flexibility or compressibility.

Power and energy efficiencies are also improved. For instance, as the noise qualities of an enclosure are improved, the signal qualities also improve, and the circuits and other components contained within the enclosure can operate with lower voltages, use fewer parts, less power, and so forth. Server farms use massive amounts of energy to operate multiple circuit boards and other components, sometimes 24 hours per day, 365 days per year.

In other words, the power consumption characteristics and energy efficiencies associated with components operating within an enclosure can be significantly improved, and can reduce these demands on the energy infrastructure. Given that there are millions of enclosures having circuit boards and other devices contained therein, such power and energy improvements can quickly multiply into significant reductions in power usage, battery production and disposal, etc., thereby boosting conservations efforts worldwide.

Methods for construction the noise dampening gasket and tape are also contemplated as described herein. For example, a method for constructing a noise dampening gasket (e.g., 100/200) can include arranging a plurality of concentric layers, as described in detail above, one atop another, around the inner core, and infusing epoxy into the carbon material layer. A method for constructing the noise dampening tape can include forming the various layers, as described in detail above, one atop another, and rolling or otherwise winding the layers around a core for simple storage, transporting, and dispensing or other usage.

Individual carbon fibers or tows of carbon fibers form the carbon fiber layer. The carbon fibers of the carbon fiber layer can be treated with silicone to enhance their mechanical and electromagnetic properties. The silicone we have used is Polydimethylsiloxane in the form of MG Chemicals Silicone Conformal Coating 422B. The silicone can be applied by spray, brush, or immersion. The coating of silicone on the carbon fiber acts as an electrical insulating layer. The silicone treated carbon fibers lowers the electrical resistivity of the carbon fibers.

Alternatively, the carbon fibers of the carbon fiber layer can be treated with polytetrafluoroethylene to enhance their mechanical and electromagnetic properties. The polytetrafluoroethylene (PTFE) we have used is Teflon® manufactured by DuPont. The polytetrafluoroethylene can be applied by spray, brush, immersion, and then sintering or compaction. The coating of polytetrafluoroethylene on the carbon fiber acts as an electrical insulating layer. The polytetrafluoroethylene treated carbon fibers lower the electrical resistivity of the carbon fibers.

Untreated carbon fibers tend to be hydrophilic. Environmental conditions, e.g. relative humidity and heat, can adversely affect the electromagnetic and mechanical properties of untreated carbon fibers. Untreated carbon fibers are brittle and easily break, spall and fray with handling or mechanical stress. Using the ASTM-D3217: 2007 Standard Test Method for Breaking Tenacity of Manufactured Textile Fibers in Loop or Knot Configurations, a 3 k tow of untreated carbon fibers were over-hand knotted and subjected to increasing force until the knot broke. The tow of untreated carbon fibers broke under less than 1 kg of pull.

Silicone treated carbon fibers are hydrophobic. Silicone treated carbon fibers improve the stability of the mechanical, electromagnetic, and thermal properties over a range of environmental conditions. Silicone treated carbon fibers are supple and bend without breaking under mechanical stress. Silicone treated carbon fibers are easy to mold and do not break if mechanically stressed by sharp radius bends. When subjected to the same ASTM-D3217: 2007 Standard Test Method for Breaking Tenacity of Manufactured Textile Fibers in Loop or Knot Configurations, a 3 k tow of silicone-treated carbon fibers demonstrated increased mechanical strength. The tow broke under 6.1 kg of pull.

Likewise, polytetrafluoroethylene treated carbon fibers are hydrophobic. Polytetrafluoroethylene treated carbon fibers improve the stability of the mechanical, electromagnetic, and thermal properties over a range of environmental conditions. Polytetrafluoroethylene treated carbon fibers are supple and bend without breaking under mechanical stress. Polytetrafluoroethylene treated carbon fibers are easy to mold and do not break if mechanically stressed by sharp radius bends. A 3 k tow of polytetrafluoroethylene treated carbon fibers was subjected to the ASTM-D3217: 2007 Standard Test Method for Breaking Tenacity of Manufactured Textile Fibers in Loop or Knot Configurations. The tow of polytetrafluoroethylene treated carbon fibers was able to withstand more mechanical stress and broke at 7.1 kg of pull. Polytetrafluoroethylene treated carbon fibers are also less bendable than silicone treated carbon fibers but more bendable than untreated carbon fibers. Further, polytetrafluoroethylene treated carbon fibers have more "memory" than untreated or silicone treated carbon fibers. In other words, a polytetrafluoroethylene treated carbon fabric may temporarily assume a different configuration when mechanical force is applied. However, the polytetrafluoroethylene treated carbon fabric will return to its original shape once the force is removed. The step at which sintering or compaction is applied to the polytetrafluoroethylene treated carbon fabric determines the original shape of the fabric.

Depending on the application, different fabric structures and alignments can be used to take advantage of the polarization properties of the carbon fibers, as shown in FIGS. 12A-12G. For example, a simple axially-aligned fiber structure (FIG. 1) or helical fiber structure (FIG. 1) is useful to surround the inner core. For many applications, a standard over-under weave (FIG. 12A) or a twill woven pattern (FIG. 12B) suffices. Multiple aligned, non-woven layers can be laminated in transverse directions. In some situations, a circular or spiral basket weave can be useful. Another acceptable fabric structure is a braid formation. Further, a pile structure (FIG. 12C) may be preferable to form a fabric with a Z-axis for radiation attenuation. A pile structure includes a surface of upright strands, which may be uncut/looped (1204), cut (1208), or a mixture of cut and uncut strands (1206). The height of the strands may vary from 1 to 30 millimeters and may but are not required to be of uniform height.

Figure 12A:
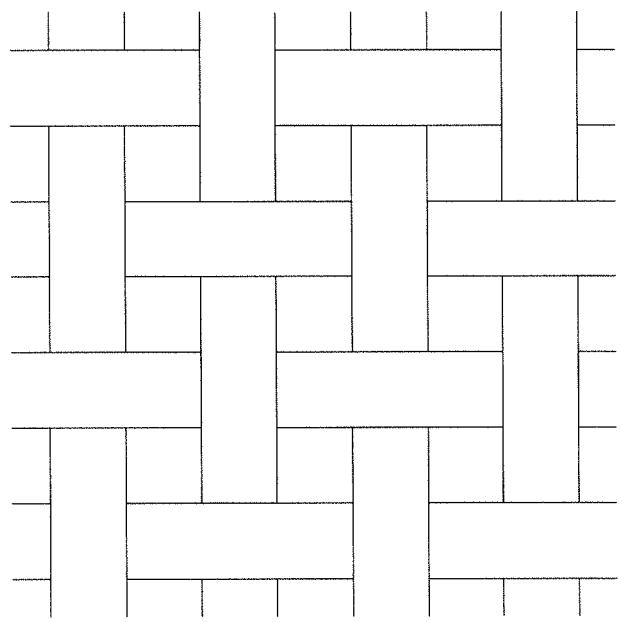
FIGS. 12A and 12B illustrate acceptable fabric structures and construction for the carbon fiber layer.
Figure 12B:
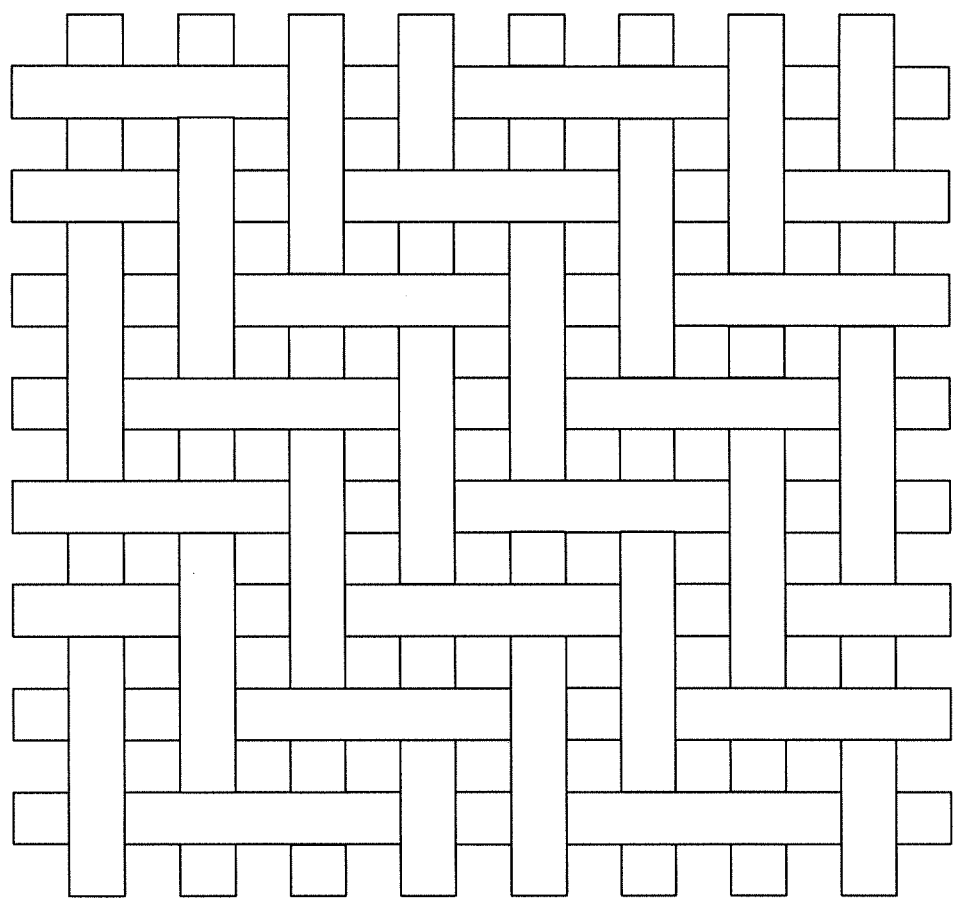
Figure 12C:
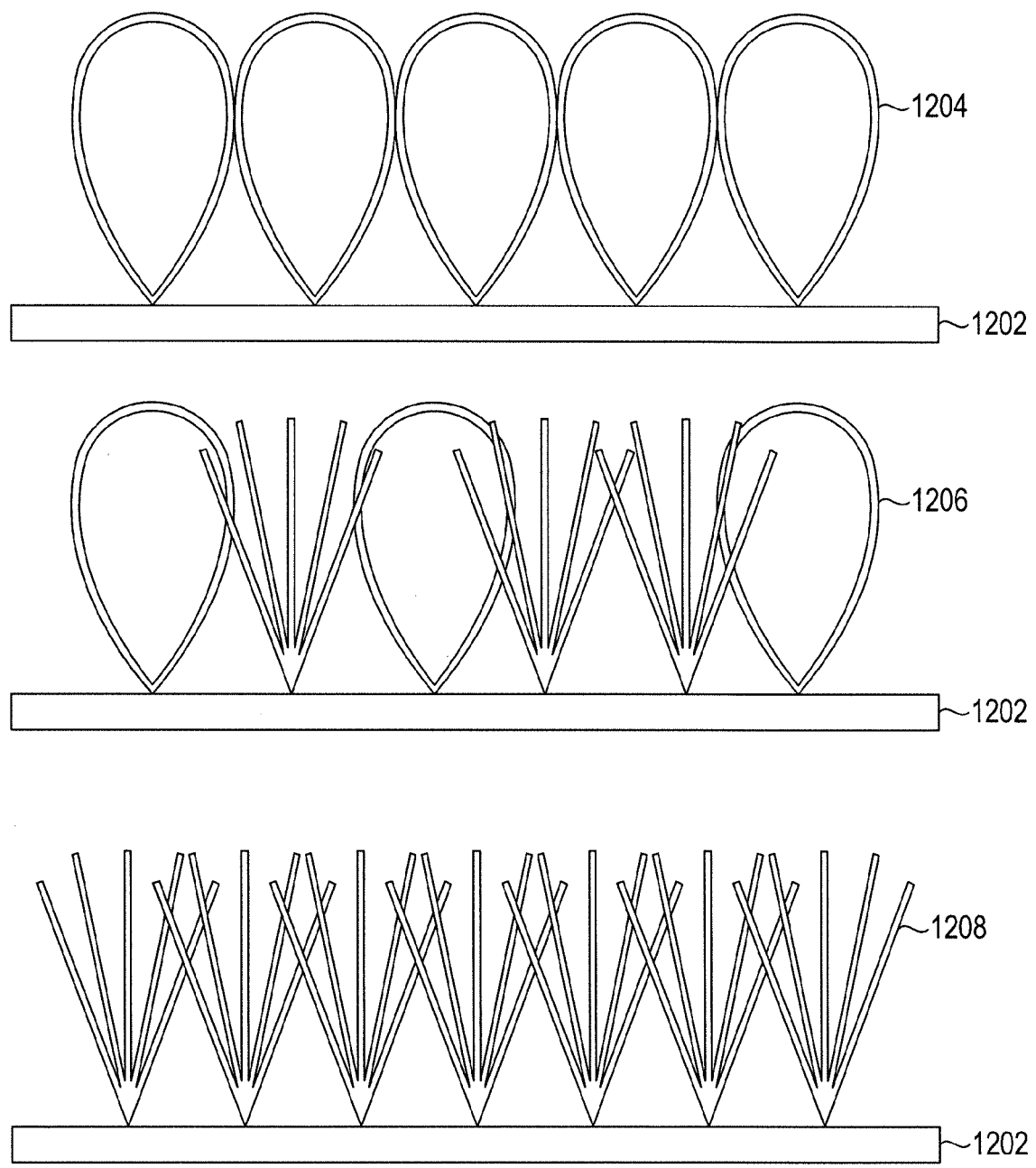
FIGS. 12C, 12D and 12E show Z-axis structures for the carbon fiber material.

As shown in FIG. 12C, the substrate (1202) in the fabric may be woven. Further, the materials forming the substrate (1202) may be conductive, insulative or a mixture of conductive and insulative materials. Embodiments of piled fabric include velvet, corduroy, and velveteen.

Figure 12D:
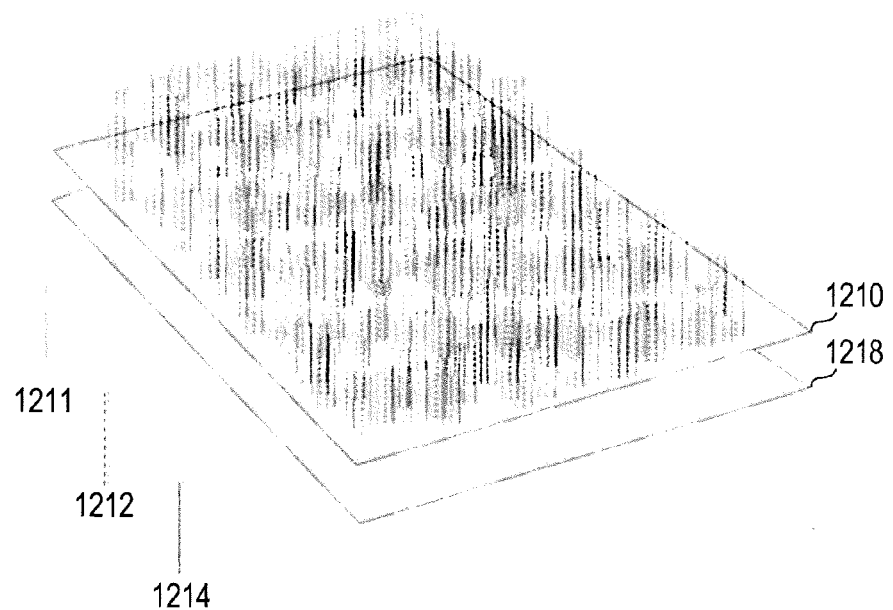
Figure 12E:
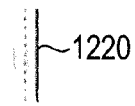

FIG. 12D depicts another perspective of the carbon fiber fabric (1210) assuming a pile structure with a Z-axis for radiation attenuation. The carbon fiber fabric (1210) may be composed of any one or more of the following: insulative (dielectric) materials (1211), carbon fibers (1212), and metal strands (1214). An optional stabilizer or adhesive layer (1218) may be attached to the carbon fiber fabric. The carbon fiber layer (1210) may be non-woven (1220) as shown in FIG. 12D. One embodiment of the unwoven carbon fiber fabric (1220) may be a mixture of free-standing materials, or in an alternative embodiment, the unwoven carbon fiber is a rigid matrix assembled by using the butcher block method. The top layer of the butcher block may then to cut to form the Z-axis strands.

Figure 12F:
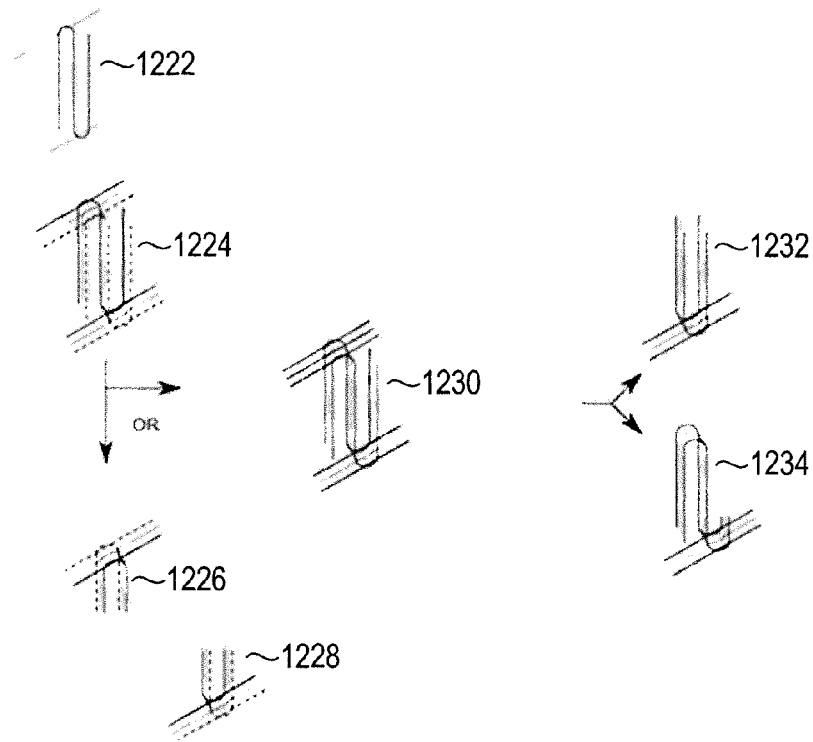
FIG. 12F shows processes for making Z-axis carbon fiber materials.

FIG. 12F depicts one embodiment of a method for forming woven carbon fiber fabric. At step 1222, a single, double-faced woven strand of any one of the materials listed in FIG. 12D is formed by double warp weaving. The single strands formed at step 1222 are then joined together to form a mixture of insulation, metal, and/or carbon fibers at step 1224. After step 1224, there are two methods to form the Z-axis strands. The pile may then be cut along the mid-line to yield two velvet surfaces (1226 and 1228). Alternatively, rails may be inserted into the top loops during the weaving process (1230). The rails can then be used as a loop cutting guide (1232). If loops are desired, the rails may simply be removed (1234).

The carbon fiber layer can be incorporated into quilted fabrics with multiple conductive layers as shown in FIGS. 13A-D. In such quilted fabrics, the conductive layer can be made from a fabric woven with conductive threads. The quilt is layered and stitched together with nonconductive threads. The quilted fabric can also be vacuum formed with epoxy resins to form rigid structural materials.

Figure 13A:
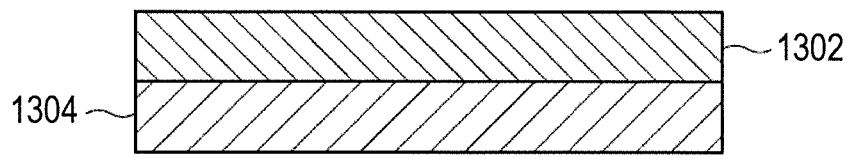
FIG. 13 illustrates cross-sectional views of examples of single and multilayer fabrics incorporating a treated carbon fiber layer and conductive layer/fabric (FIGS. 13A and 13B) and an untreated carbon fiber layer (FIGS. 13C and 13D) with a dielectric layer between the carbon fiber layer and the conductive layer/fabric.
Figure 13B:
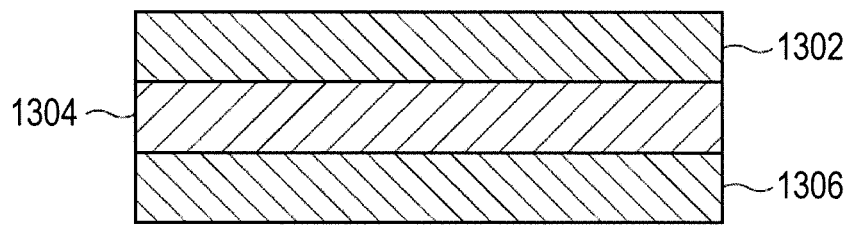

The treated carbon fiber can be setup in laminates in which a treated carbon fiber layer is in direct contact with the metal layer, for example, as shown in FIGS. 13A and 13B. The coating on the carbon fibers acts as thin dielectric layer that insulates the carbon fiber layer from the metal layer.

Figure 13C:
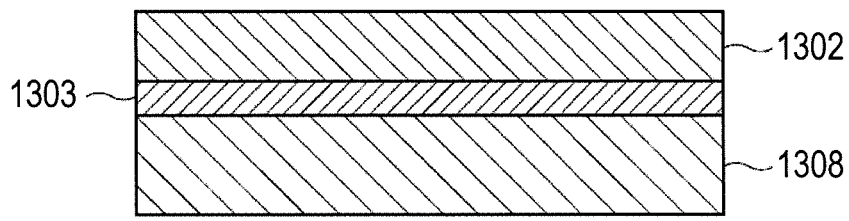
Figure 13D:
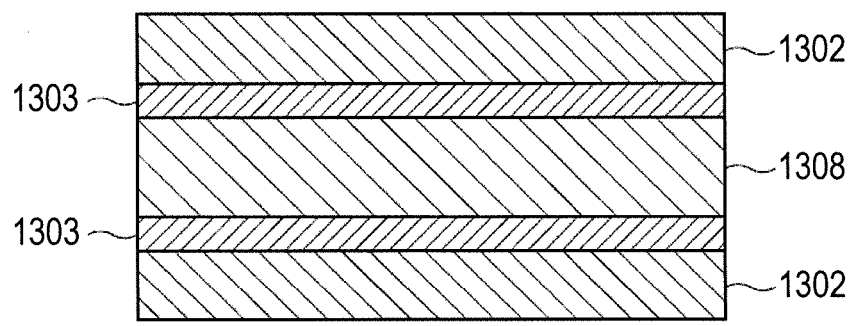

In FIGS. 13A-13D, like layers are denoted by like reference numerals. FIG. 13A shows what can be called a single layer carbon fiber composite which includes a conductive layer/fabric 1302 on a carbon fiber layer 1304. The conductive layer/fabric can be formed of a metallic layer, or a fabric that contains conductive threads, such as copper threads. The carbon fiber layer 1304 is formed by woven, non-woven, piled, braided, or aligned carbon fibers that have been treated with a suitable compound that makes the individual fibers insulative, such as polydimethlylsiloxane or polytetrafluoroethylene (e.g., Teflon®). FIG. 13B shows a multiple layer version of the structure of FIG. 13A, in which the treated carbon fiber layer 1304 is sandwiched between two layers of the conductive layer/fabric 1302. FIG. 13C shows a single layer of untreated carbon fiber fabric 1308, similar to layer 1304 but not silicone or polytetrafluoroethylene treated, with a contacting dielectric or insulative layer 1303 separating the carbon fiber fabric 1308 from the conductive layer/fabric 1302 and 1306. FIG. 13D shows a multilayer version of the composite of FIG. 13C in which the untreated carbon fiber fabric 1308 is sandwiched between two layers of dielectric 1303 and conductor 1302. These composite carbon fiber fabrics are usable in the noise dampening gasket or tape.

Consequently, in view of the wide variety of permutations to the embodiments described herein, this detailed description and accompanying material is intended to be illustrative only, and should not be taken as limiting the scope of the invention.

The invention claimed is:

1. A noise dampening gasket comprising:
   an inner core section;
   a carbon material layer comprising carbon fiber strands surrounding the inner core section;
   an insulating layer surrounding the carbon material layer;
   a metal shield layer surrounding the insulating layer; and
   wherein the carbon fiber layer further comprises metal strands.

2. The noise dampening gasket of claim 1, wherein the metal shield layer, the insulating layer, and the carbon material layer form an electromagnetic dampening zone in which the carbon material layer enhances the shielding characteristics of the metal shield layer.

3. The noise dampening gasket of claim 2, wherein the inner core section includes a cylindrical opening therein extending axially through the gasket.

4. The noise dampening gasket of claim 3, further comprising a conductor disposed within the opening of the inner core section.

5. The noise dampening gasket of claim 4, wherein the electromagnetic dampening zone is structured to reduce electromagnetic noise emitted by the conductor.

6. The noise dampening gasket of claim 1, wherein:
   the carbon material layer directly contacts the inner core section;
   the insulating layer directly contacts the carbon material layer; and
   the metal shield layer directly contacts the insulating layer.

7. The noise dampening gasket of claim 1, wherein the carbon fiber strands and the metal strands are woven.

8. The noise dampening gasket of claim 1, wherein the metal strands are piled.

9. The noise dampening gasket of claim 1, wherein the metal strands are disposed in parallel relative to an axial direction of the inner core section.

10. The noise dampening gasket of claim 1, wherein the metal strands are arranged helically.

11. A noise dampening gasket comprising:
    an inner core section;
    a carbon material layer surrounding the inner core section;
    an insulating layer surrounding the carbon material layer;
    a metal shield layer surrounding the insulating layer; and
    the carbon material layer includes resin-impregnated carbon fiber having a specific resistance no greater than 100 $\Omega/cm^2$.

12. A noise dampening gasket comprising:
    an inner core section;
    a carbon material layer surrounding the inner core section;
    an insulating layer surrounding the carbon material layer;
    a metal shield layer surrounding the insulating layer; and
    wherein the carbon material layer includes fiber strands disposed in parallel relative to an axial direction of the inner core section.

13. The noise dampening gasket of claim 12, wherein substantially all of the fiber strands of the carbon material layer are disposed in parallel relative to the axial direction of the inner core section.

14. A noise dampening gasket comprising:
    an inner core section;
    a carbon material layer surrounding the inner core section;
    an insulating layer surrounding the carbon material layer;
    a metal shield layer surrounding the insulating layer; and
    wherein the carbon material layer includes fiber strands disposed transversely relative to the axial direction of the inner core section.

15. The noise dampening gasket of claim 14, wherein substantially all of the fiber strands of the carbon material layer are disposed perpendicular relative to the axial direction of the inner core section.

16. A noise dampening gasket comprising:
    an inner core section;
    a carbon material layer surrounding the inner core section;
    an insulating layer surrounding the carbon material layer;
    a metal shield layer surrounding the insulating layer; and
    wherein the carbon material layer includes fiber strands woven to form the carbon fiber material layer.

17. A noise dampening gasket comprising:
    an inner core section;
    a carbon material layer surrounding the inner core section;
    an insulating layer surrounding the carbon material layer;
    a metal shield layer surrounding the insulating layer; and
    wherein the carbon material layer includes fiber strands basket-woven or braided to form the carbon fiber material layer.

18. A noise dampening gasket comprising:
    an inner core section;
    a carbon material layer surrounding the inner core section;
    an insulating layer surrounding the carbon material layer;
    a metal shield layer surrounding the insulating layer; and
    wherein the carbon material layer includes fiber strands arranged helically to form the carbon fiber material layer.

19. A noise dampening gasket comprising:
    an inner core section;
    a carbon material layer surrounding the inner core section;
    an insulating layer surrounding the carbon material layer;
    a metal shield layer surrounding the insulating layer; and
    wherein the carbon material layer includes fiber strands piled to form the carbon fiber material layer.

20. A noise dampening gasket comprising:
    an inner core section;
    a carbon material layer surrounding the inner core section;
    an insulating layer surrounding the carbon material layer;
    a metal shield layer surrounding the insulating layer; and
    wherein the carbon material layer includes fiber strands aligned to form the carbon fiber material layer.

21. A noise dampening gasket comprising:
    an inner core section;
    a carbon material layer surrounding the inner core section;
    an insulating layer surrounding the carbon material layer;
    a metal shield layer surrounding the insulating layer; and
    wherein the carbon material layer includes fiber strands coated with polytetrafluroethylene.

22. A noise dampening gasket comprising:
    an inner core section;
    a carbon material layer surrounding the inner core section;
    an insulating layer surrounding the carbon material layer;
    a metal shield layer surrounding the insulating layer; and
    wherein the carbon material layer includes fiber strands coated with silicone.

23. A noise dampening gasket comprising:
    an inner core section;
    a carbon material layer surrounding the inner core section;
    an insulating layer surrounding the carbon material layer;
    a metal shield layer surrounding the insulating layer; and wherein the carbon material layer includes coated carbon fibers that enhance mechanical and electrical properties of the carbon material layer.

24. The noise dampening gasket of claim 23, wherein the carbon fiber layer is resistant to breakage and spalling.

\* \* \* \* \*